(12) United States Patent
Zieren

(10) Patent No.: US 8,659,285 B2
(45) Date of Patent: Feb. 25, 2014

(54) CURRENT SENSOR AND CURRENT SENSING METHOD

(75) Inventor: Victor Zieren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 325 days.

(21) Appl. No.: 13/122,826

(22) PCT Filed: Oct. 9, 2009

(86) PCT No.: PCT/IB2009/054436
§ 371 (c)(1),
(2), (4) Date: Apr. 6, 2011

(87) PCT Pub. No.: WO2010/041221
PCT Pub. Date: Apr. 15, 2010

(65) Prior Publication Data
US 2011/0193546 A1    Aug. 11, 2011

(30) Foreign Application Priority Data
Oct. 9, 2008    (EP) ..................................... 08105530

(51) Int. Cl.
*G01R 19/00*    (2006.01)
(52) U.S. Cl.
USPC ........ 324/76.11; 324/109; 324/126; 324/149; 324/750.16

(58) Field of Classification Search
USPC .................. 324/76.11, 109, 126, 750.16, 149
See application file for complete search history.

(56) References Cited

U.S. PATENT DOCUMENTS

| 4,528,502 | A | 7/1985 | Rocha |
| 5,422,566 | A | 6/1995 | Boenning |
| 6,466,005 | B1 * | 10/2002 | Yao et al. .................. 324/117 R |
| 6,617,750 | B2 * | 9/2003 | Dummermuth et al. ...... 310/309 |
| 6,690,178 | B2 * | 2/2004 | Harris et al. ................... 324/649 |
| 7,221,144 | B2 * | 5/2007 | Berkcan et al. ............... 324/126 |

* cited by examiner

*Primary Examiner* — Jermele M Hollington
*Assistant Examiner* — James Split

(57) ABSTRACT

A current sensor, comprises an input conductor (IN) which is supplied with the current to be sensed and an output conductor (OUT) from which the current to be sensed is output. A conductor path is provided between the input conductor and the output conductor, wherein the path is provided on a first, movable element (1) and a second, fixed element (2). The path defines a pair of adjacent path portions (3,5; 3;4), one of the path portions (4;5) on the fixed element and the other (3) on one side of the movable element. An arrangement detects movement of the movable element to determine the current flowing. This arrangement uses a conductor path which can be part of the circuit being tested, and thereby does not require any additional components, other than the movement detector.

18 Claims, 12 Drawing Sheets

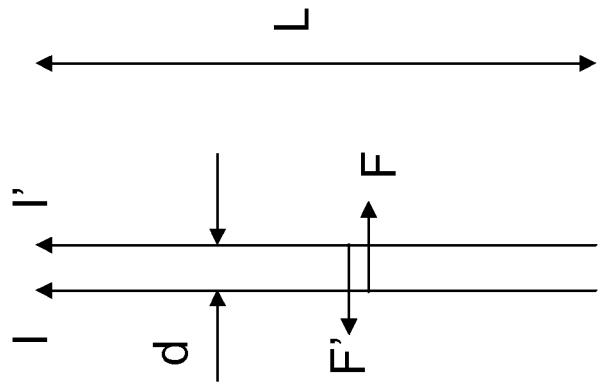
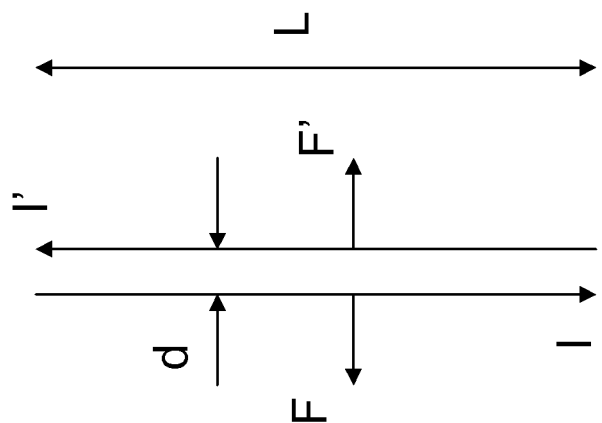
Fig. 1

CURRENT SENSOR AND CURRENT SENSING METHOD

This invention relates to current sensor and current sensing methods. Particularly, but not exclusively, the invention relates to current sensing arrangements which can be integrated into an IC.

The measurement of currents flowing in a conductor on an integrated circuit has many applications. Supply line currents of cores in a system on chip (SoC) are preferably measured without a series resistance or other passive element in the line, because of unwanted voltage drop. Therefore, an indirect method is preferred, such as the detection of the magnetic field associated with that current.

In silicon, a magnetic sensor made out of silicon must be used, such as a Hall plate or a magneto-transistor. For small currents this method is not feasible because of the small Hall mobility of silicon, by which a Si-based sensor has a modest sensitivity.

Another possible solution is the use of exotic backend metallic materials, such as used for anisotropic magnetoresistor (AMR) or giant magnetoresistor (GMR) sensors. These materials are not easily applicable in a CMOS production facility, and give a risk of pollution hazards.

The integration of current sensors onto an IC has been proposed, using MEMS structures. An external conductor is used, and the sensor measures the current in the external conductor by the magnetic stray field. An example of application of these sensors is to detect power consumption in domestic appliances, mains power lines etc.

The known sensors provide additional complexity to the IC and require additional components and area. In particular, known IC current sensors have a first arrangement for generating a magnetic field, and a second arrangement for detecting current flowing based on the interaction with the magnetic field.

According to the invention, there is provided a current sensor, comprising:

an input conductor which is supplied with the current to be sensed; and an output conductor from which the current to be sensed is output, wherein the sensor further comprises a conductor path between the input conductor and the output conductor, wherein the path is provided on a first, movable element and a second, fixed element, and wherein the path defines:

a pair of adjacent path portions, one of the path portions on the fixed element and the other on one side of the movable element, wherein the sensor further comprises an arrangement for detecting movement of the movable element.

This arrangement uses a conductor path which can be part of the circuit being tested, and thereby does not require any additional components, other than the movement detector. The conductor path is provided on a movable element and a fixed element, and the interaction between parts of the path, with currents flowing through them, results in movement of the movable element. The single conductor path, in series along the conductor through which the current to be measured is flowing, performs both functions of generating magnetic fields and providing measurable interaction with the magnetic field as a movement of a movable element. The invention thus provides a compact arrangement and which can easily be fully integrated into the IC manufacturing processes.

In a preferred arrangement, the path defines:

a first pair of adjacent first path portions with current flow in the same direction, one of the first path portions on the fixed element and the other on one side of the movable element; and a second pair of adjacent second path portions with current flow in opposite directions, one of the second path portions on the fixed element and the other on an opposite side of the movable element, wherein the detecting arrangement is for detecting side to side movement of the movable element.

In this way, the path defines two interactions which result in opposite forces (attractive forces at one location and repulsive forces at another location). The movable element can then be caused to move one way (sideways) under the combined influence of these forces.

The movable element can comprise a beam arrangement and a head, with the path extending around the outside of the beam arrangement and head, wherein the others of the first and second path portions are at opposite sides of the head. The head is thus sandwiched between conductor portions (the "other" path portions), with current flow giving attraction to the fixed portion at one side and repulsion away from the fixed portion at the other side.

The path preferably comprises a closed path, with a tap into the path made by the input conductor and a tap out of the path made by the output conductor. Thus, the sensor can be implemented simply as a closed path shape which is in line with a conductor along which the current to be sensed is flowing.

The detecting arrangement can be mounted on the beam arrangement, for example in the form of at least one piezoresistive element.

The beam arrangement can comprise a single beam, or two beams on opposite sides of the head. The head can be a quadrilateral, with the beams on two opposite faces, and the path portions on the other two opposite faces. This provides a compact configuration.

The sensor can further comprise a calibration part for detecting movement of the sensor which is independent of the current being sensed. This enables the sensor to cancel beam/head movement which is not the result of the current flowing.

The calibration part can comprise a further conductor path provided on a third movable element and a fourth fixed element, and wherein the path defines a third pair of adjacent third path portions with one of the third path portions on the fixed element and the other on one side of the movable element, and a fourth pair of adjacent fourth path portions with one of the fourth path portions on the fixed element and the other on an opposite side of the movable element, wherein the path is arranged such that current flow around the path does not induce movement of the beam, and the calibration part further comprises an arrangement for detecting movement of the movable element. In this way, the calibration part has the same structure as the main current sensor part, so that they can be implemented by the same processing steps.

The first, movable element and the second, fixed element can for example comprise part of a MEMS structure.

The invention also provides a current sensing method, comprising:

providing a current to be sensed;

using the current to be sensed to provide current path on a first, movable element and a second, fixed element, and wherein the path defines:

a pair of adjacent path portions, one of the path portions on the fixed element and the other on one side of the movable element; and outputting the current to be sensed; and detecting movement of the movable element to enable the current to be sensed to be determined.

Examples of the invention will now be described in detail with reference to the accompanying drawings, in which:

FIG. 1 is used to explain the forces which arise between current carrying conductors;

The invention provides a current sensor in which the interaction force between current-carrying conductors is used as a basis of measuring current.

Standard physics text books, such as Alonso-Finn ("Fundamental University Physics", Part II, Fields and Waves, Addison-Wesley, $10^{th}$ Printing, 1979) treat the well-known principle of forces between currents.

When currents I and I' flow in parallel conductors, but in opposite direction, then a repelling force is exerted on the conductors. When the currents flow in the same, parallel direction, the conductors will be attracted. FIG. 1 shows the different parameters for these two situations. The force is calculated as:

$$|F|=|F'|=2\times 10^{-7} I \cdot I' L/d \quad (1)$$

where I and I' are the currents in the two conductors, L is the length over which they are parallel, and d is the distance between the conductors.

Figure 2:
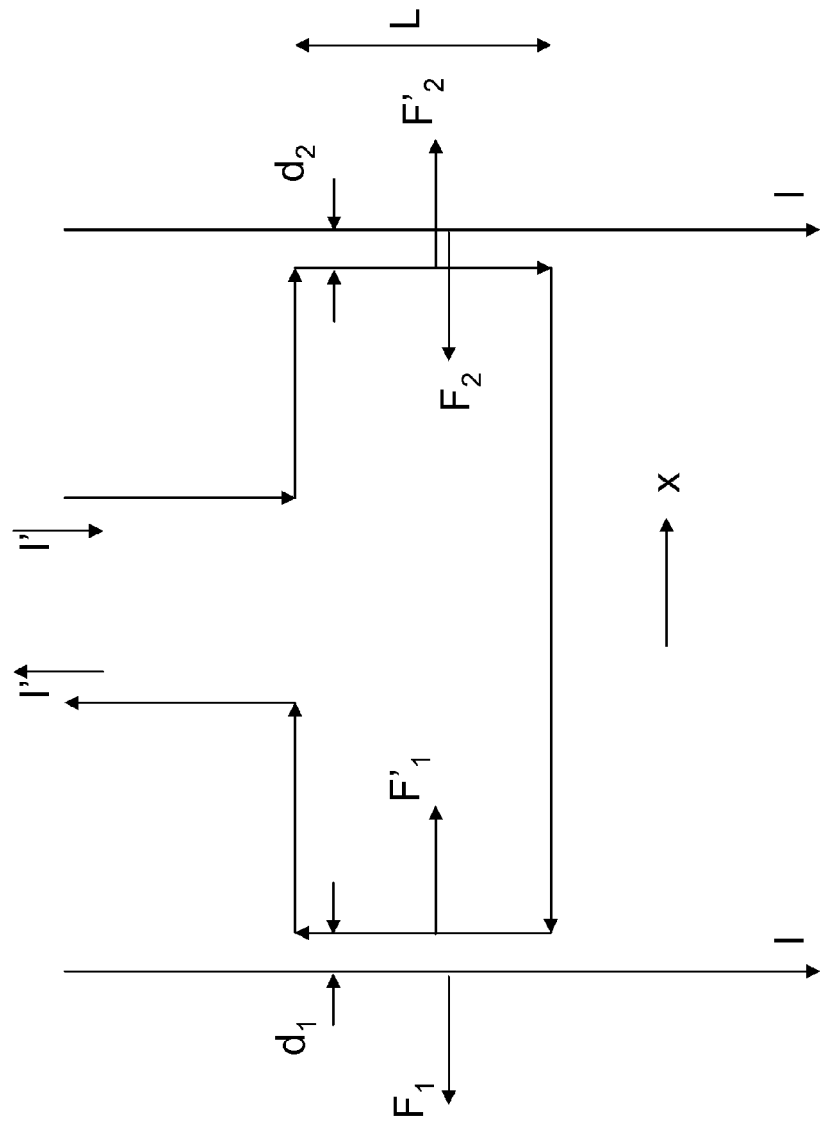
FIG. 2 shows a conductor arrangement which is used in the current sensor of the invention.

FIG. 2 shows the situation for a loop carrying a current I', between two conductors, each carrying a current I. The current directions are such that the left-hand part of the loop has a repelling force ($F_1=-F'_1$) between the parallel conductor parts, whereas the right-hand part sees an attracting force ($F'_2=-F_2$) between the parallel conductor parts over a length L.

$$|F_1|=|F_1'|2\times 10^{-7} I \cdot I' \cdot L/d_1 \quad (2)$$

$$|F_2|=|F_2'|=2\times 10^{-7} I \cdot I' \cdot L/d_2 \quad (3)$$

where $d_1$ and $d_2$ are the distances between the left- and right-hand side conductors, respectively. From FIG. 2, the total force in the x-direction, $F_{tot,x}$ acting on the loop conductor equals $F'_1+F'_2$.

As these forces are pointing in the same direction:

$$F_{tot,x}=2\times 10^{-7} I \cdot I' \cdot L(1/d_1+1/d_2). \quad (4)$$

Figure 3:
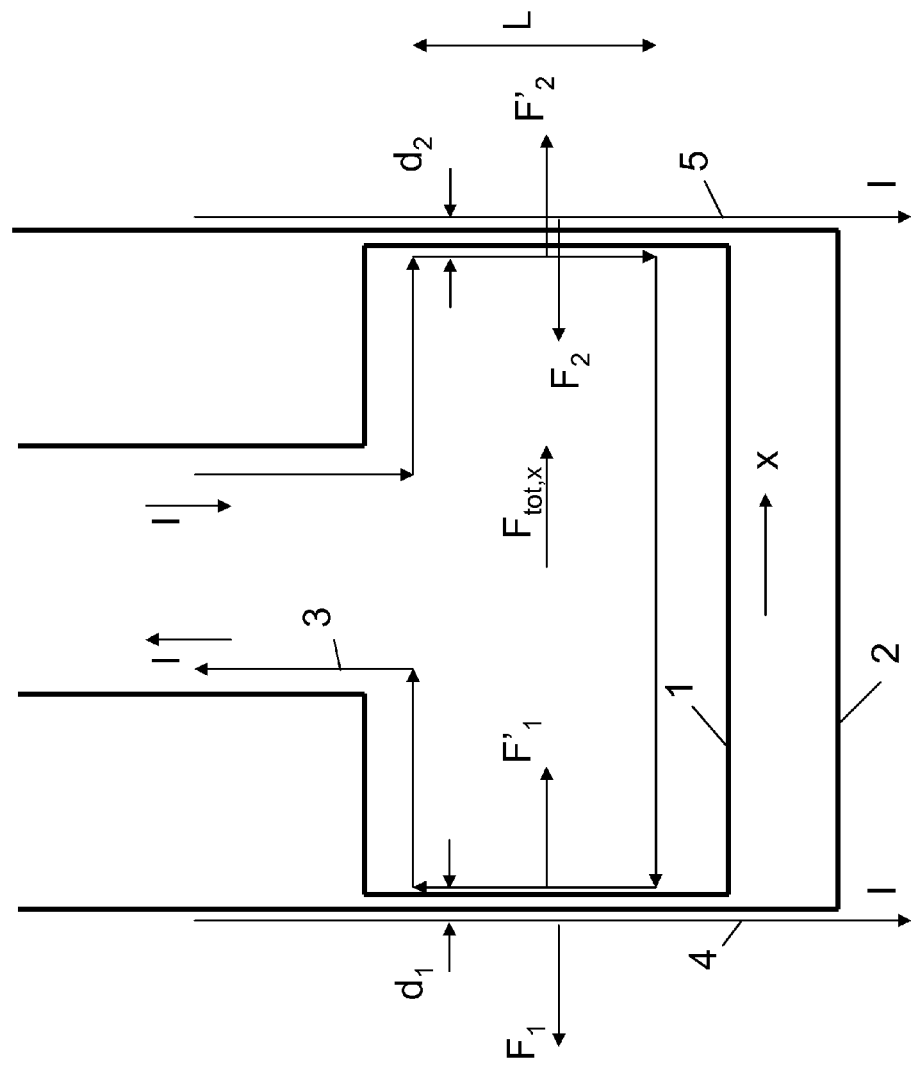
FIG. 3 shows an example of conductor arrangement of the invention in more detail.

In the preferred examples of the invention, this loop configuration is used to cause a series current to result in a movement of a component, which can be detected. FIG. 3 shows the part of a construction according to the invention.

The current loop 3 is placed on a movable body 1, and the other conductors 4 and 5 are placed on a fixed body 2.

Then, the force $F_{tot,\,x}$ will act on the movable body 1, to displace the body 1 by an x-displacement, δ (to the right). We may write:

$$d_1=d+\delta \quad (5)$$

$$d_2=d-\delta \quad (6)$$

provided that $d_1$ and $d_2$ equal d when I and/or I' are zero. In the case that I=I':

$$F_{tot,x}=2\times 10^{-7} I^2 \cdot L \cdot (2/d)/(1-(\delta/d)^2). \quad (7)$$

For small δ this may be approximated by $$F_{tot,x}=2\times 10^{-7} I^2 \cdot L \cdot (2/d). \quad (8)$$

Thus, the current I may cause the displacement δ, without any need for another current. The force is applied in such a way to that the displacement can be detected as explained below.

Figure 4:
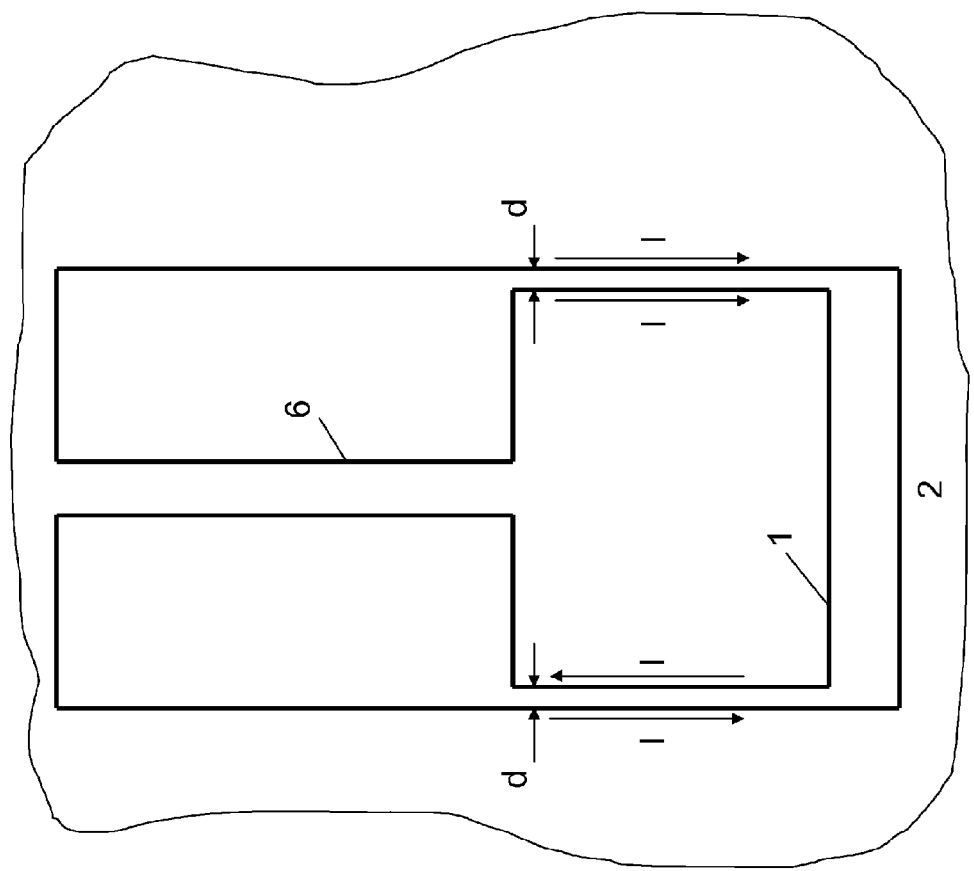
FIG. 4 shows a first example of sensor of the invention.

FIG. 4 shows that the movable body 1 is in the form of a head which is connected through a beam 6 with the fixed body 2. The position of the movable body 1 is drawn for I=0, so there is no force acting on it.

Figure 5:
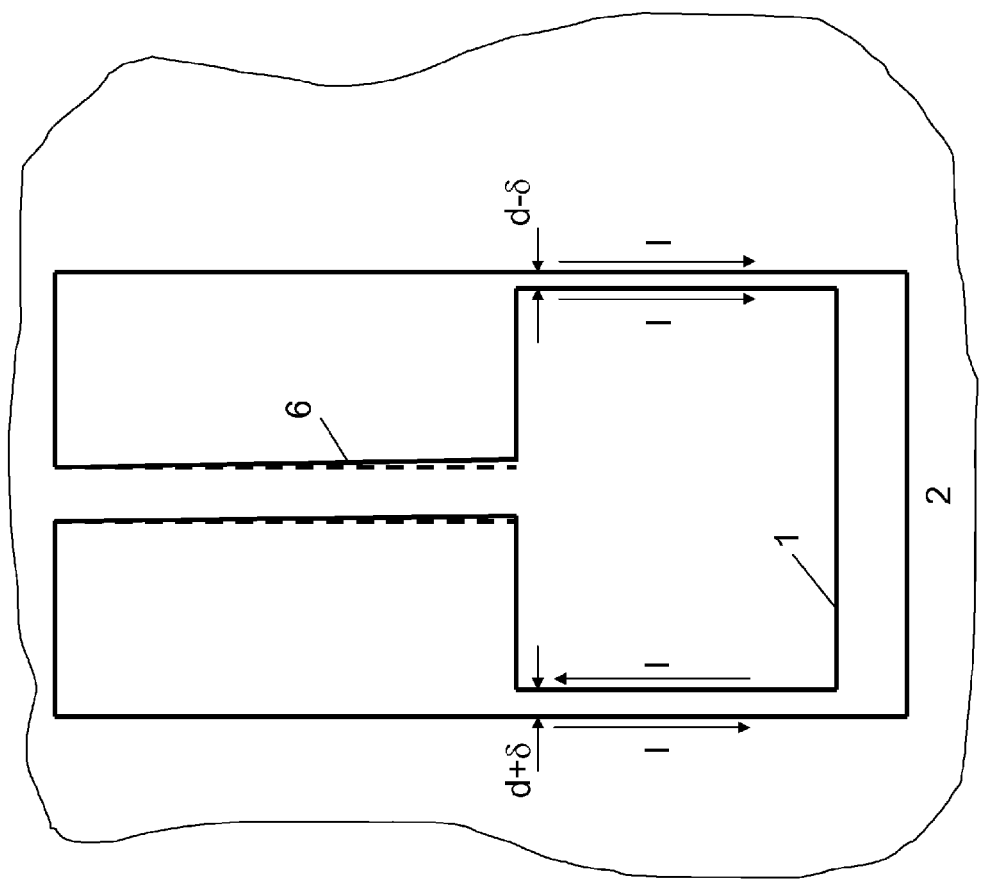
FIG. 5 shows the sensor of FIG. 4 in a desired deflected position.

FIG. 5 shows the same arrangement when I>0. It can be seen that the body has shifted to the right and that the beam 6 is bending, such that a strain is imposed on it.

The construction is designed such the head 1 will translate rather than rotate. Thus, the beam and head should be designed so that bending in the beam 6 is created by the forces applied to the head.

Figure 6:
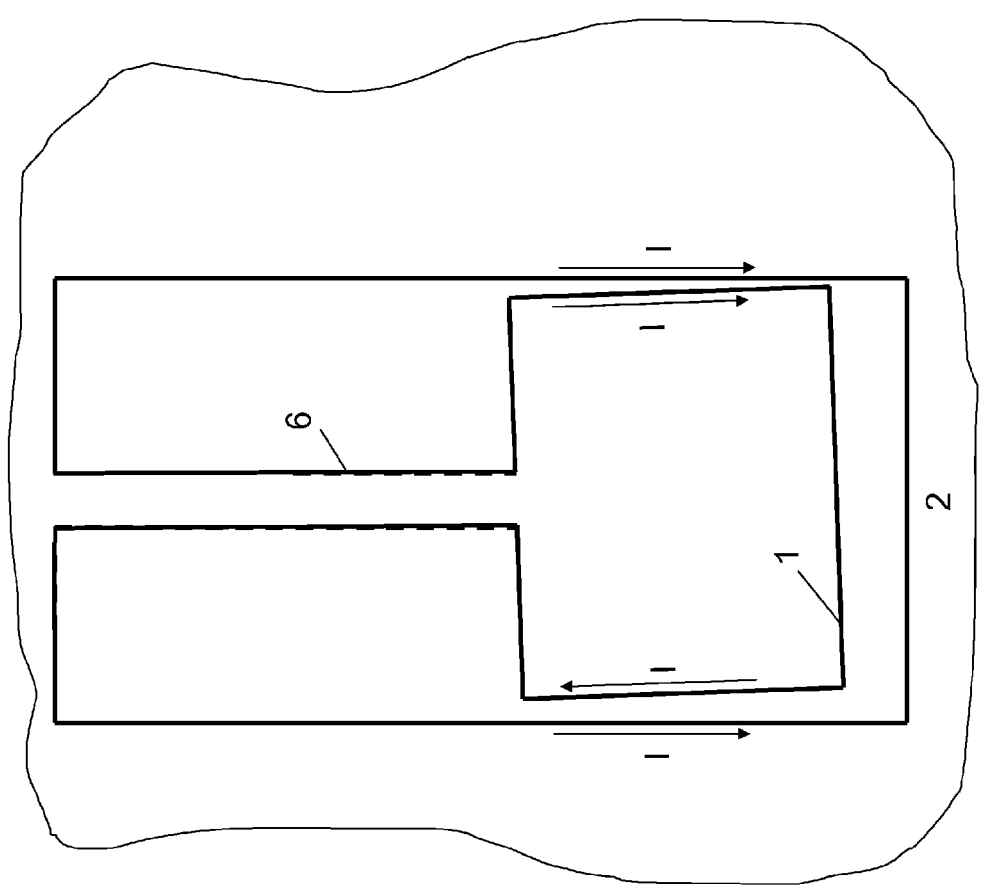
FIG. 6 shows the sensor of FIG. 4 in an undesired deflected position.

FIG. 6 shows an arrangement in which the head 1 rotates, without significant bending of the beam 6. This should be avoided.

One way to achieve this is through strengthening the junction between the head and the beam. The use of a beam on two opposite sides of the axis about which bending is to take place is another solution.

A further alternative is to provide the piezoresistive beam to one side of the bending axis, and to have a stronger beam on the opposite side. The beam bending on the bending axis may not be the optimum way of inducing a change in piezoresistance value, because the left and right halves of the beam see opposite signs of the strain, resulting in a net value of about zero change. By providing a double beam, consisting of a thin piezoresistive measuring beam and a thick beam serving as a lever, the side-to-side movement of the head is translated into compression or expansion of the piezoresistive thinner beam. The side-to-side deflection causes the thick beam to remain of almost unaltered length, whereas the thin beam will be subject to an amplified force along the length of the beam. This will cause a stronger strain and thus a larger value of the change in piezoresistance.

Any of the approaches above allow bending in the beam to be used for the detection.

The strain in beam 6 may be detected by means of one or more piezoresistive transducers, so as to provide a means to measure the displacement δ. An alternative is to do the measurement of δ by measuring the variation of a capacitance between conductors on body 1 and body 2.

The displacement of a cantilever under a force $F_{tot,\,x}$ applied to the end (that is free to bend), can be calculated by:

$$\delta = F_{tot,x} \cdot H^3/Y \cdot 3I_n \quad (9)$$

where Y is Young's modulus of the material of beam 6, H is the length of the cantilever and $I_n$ is the (area) moment of inertia. $I_n$ for the beam is given by:

$$I_n = W^3 \cdot T/12 \qquad (10)$$

where W the width in x-direction and T the thickness of the cantilever.

Figure 7:
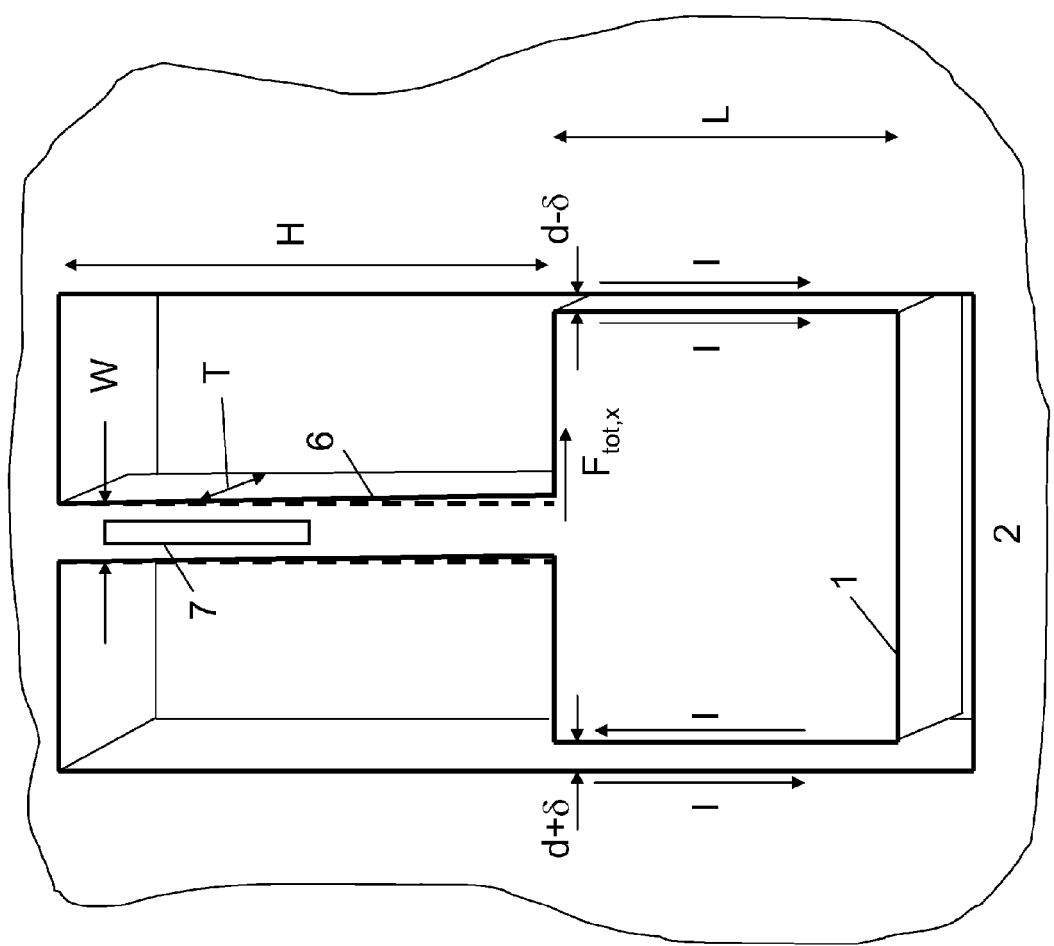
FIG. 7 shows the 3D dimensions of the sensor of FIG. 4 and shows the movement sensor in place.

These dimensions are indicated in FIG. 7, which shows the 3D layout of the fixed and movable elements. The beam and head are suspended in a cavity. It will be immediately apparent to those skilled in the art that the structure shown in FIG. 7 can be routinely manufactured using MEMS technology. This leads to:

$$\delta = 4 \cdot F_{tot,x} \cdot H^3 / Y \cdot W^3 \cdot T \qquad (11)$$

When $\delta$ is determined, it is a measure for $F_{tot,x}$ (Eq. 11) and thus, for I (Eq. 7). Eq. (8) may be used as a first estimation, after which a small iterative process will lead to the exact solution of Eq. (7). This will be shown in the following example, which assumes a fixed body 1, a movable body head 2 and beam 6, made out of silicon:

Taking:
H=600 µm, L=200 µm, T=0.5 µm, d=0.5 µm, W=0.5 µm
$Y_{si}$=150 GPa, I=10 µA.

Using Eq. (8):

$$F_{tot,x} = 2 \times 10^{-7} (10^{-5})^2 \cdot 2 \cdot (200/0.5) = 1.6 \times 10^{-14} N.$$

Using Eq. (11), $$\delta = 4 \cdot (1.6 \times 10^{-14}) \cdot (600/0.5)^3 / (150 \times 10^9 \times 0.5) = 1.5 \text{ nm}.$$

As $\delta/d = 1.5/500 = 0.003$, the approximation of Eq. (8) is valid. But if these values are calculated for a current of I=100 µA, the force will be 100 times larger: $F_{tot,x} = 1.6 \times 10^{-12}$ N. Then, also $\delta$ will become 100 times larger: $\delta$150 nm.

This implies that $\delta/d = 150/500 = 0.3$, such that Eq. (8) no longer may be used as an approximation.

In this case, this start value for $\delta$ may be used to calculate $F_{tot,x}$ more precisely, using Eq. (7). Then, using Eq. (11) with the adjusted value of $F_{tot,x}$ (in an iterative process) this eventually yields:
ti $F_{tot,x} = 1.8 \times 10^{-12} N$ and $$\delta = 168 \text{ nm}.$$

This amount of deflection is sufficient to be detected. A preferred example uses a piezoresistive readout to measure $\delta$. One or more piezoresistors are integrated in the beam 6 for this purpose. Only one resistor 7 is shown as an example in FIG. 7.

Due to the sideways bending of the bridge 6, the resistor 7 will be deformed. As explained above, this deformation can be a bending effect or it can be compression or expansion, depending on how the piezoresistive element is arranged, This is detectable using silicon as the piezoresistive material. Then, the change of the resistor value R, $\Delta R$, is a function of $\delta$. The resistor 7 is supplied with contacts and terminals to the outside of this sensor structure, in order to measure the value of R and/or $\Delta R$.

The sensor may be fabricated by using etching and other processing techniques, by which a free-hanging body 1, connected through the beam 6 to the outside substrate 2, is obtained. These processes are well-known for fabricating a silicon-based Micro-Electro Mechanical System (MEMS).

Figure 8:
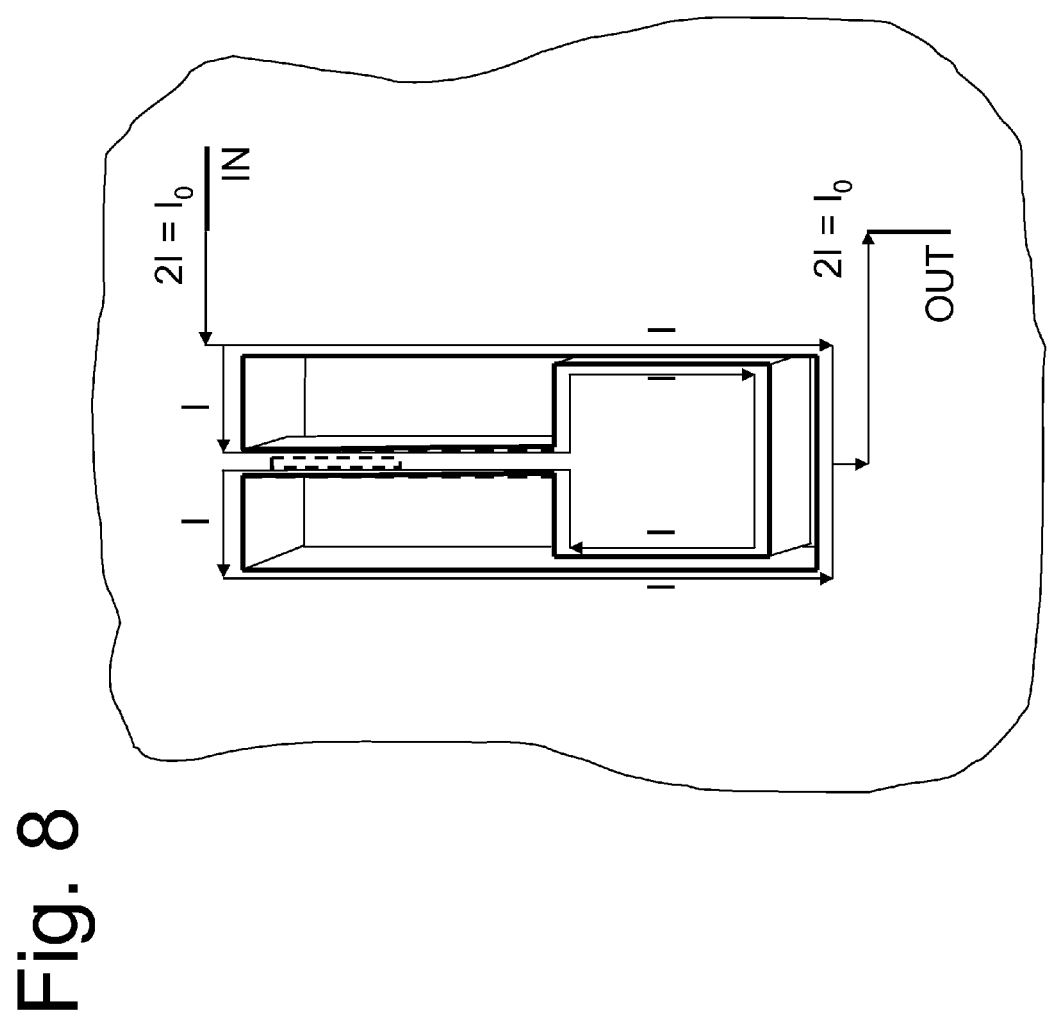
FIG. 8 shows the current flow in and out of the sensor of FIG. 4.

The current flowing around the conductive path is the current to be detected, and the sensor is simply designed in series with the desired current flow. There is no need to introduce large additional resistance. FIG. 8 shows how the current is supplied to the conductor path through an input conductor IN and exits the path through an output conductor OUT.

In FIG. 8, a current of $I_0 = 2I$ is detected. This implies that the force (and consequently, the displacement) is 4 times lower than calculated in Eqs. (7)-(8), as $I = I_0/2$ and the force is quadratically dependent on current:

$$F_{tot,x} = 10^{-7} I_0^2 \cdot (L/d)/(1-(\delta/d)^2) \qquad (12)$$

The paths between the input and output are not the same length, so to provide the desired equal split of $I_0$ in half, the conductor tracks can be designed so that the total resistance between the input and output is the same, with some tracks wider than others.

Figure 9:
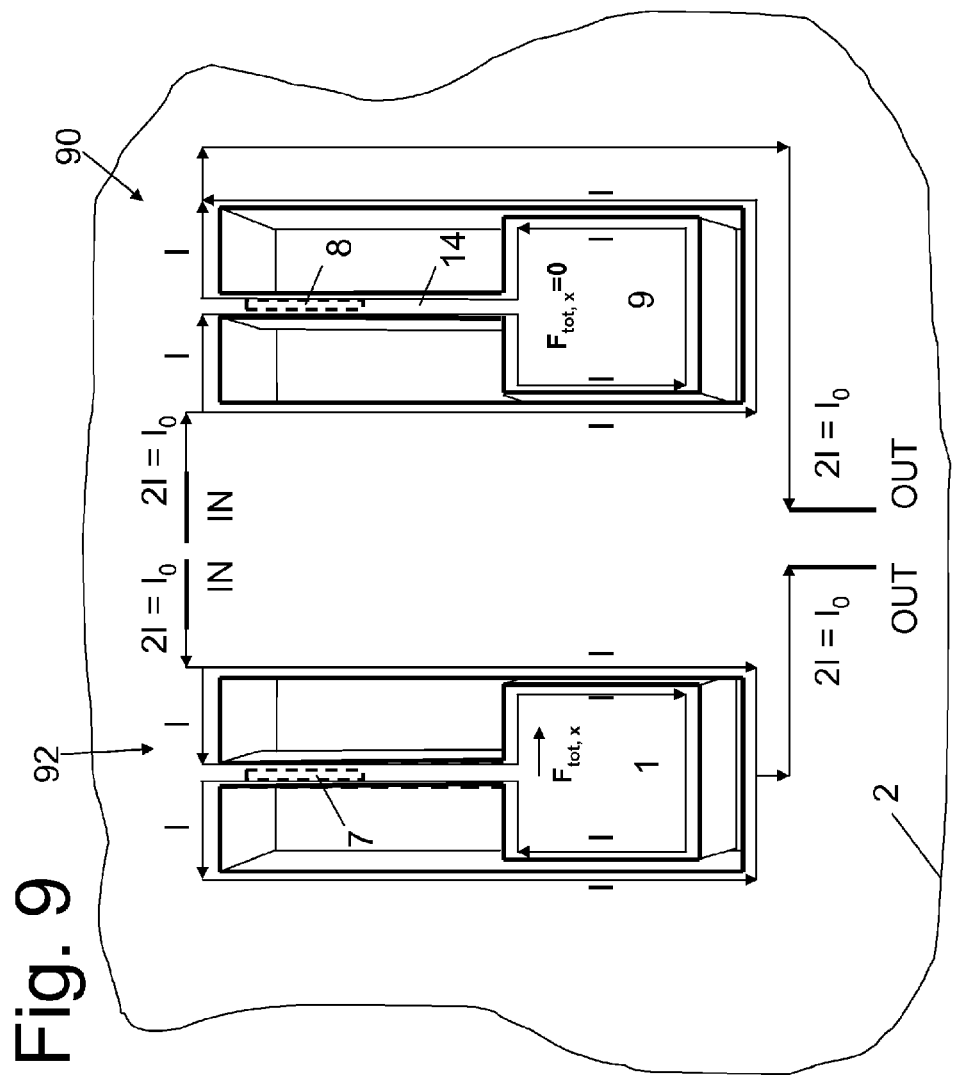
FIG. 9 shows a second example of sensor of the invention including a calibration unit.

FIG. 9 shows an embodiment in which a calibration part 90 is used for detecting movement of the sensor which is independent of the current being sensed. The calibration part 90 is of the same design as the main sensor 92 The current path is designed such that current flow around the path does not induce movement of the beam. Thus, the calibration part 90 has body 9, beam 14 and piezoresistor 8. The external wiring is such that the currents on either side of the body 9 flow in the same direction. Thus, the force $F_{tot,x}$ acting on body 9 will be zero, such that no displacement induced by current I will occur.

Figure 10:
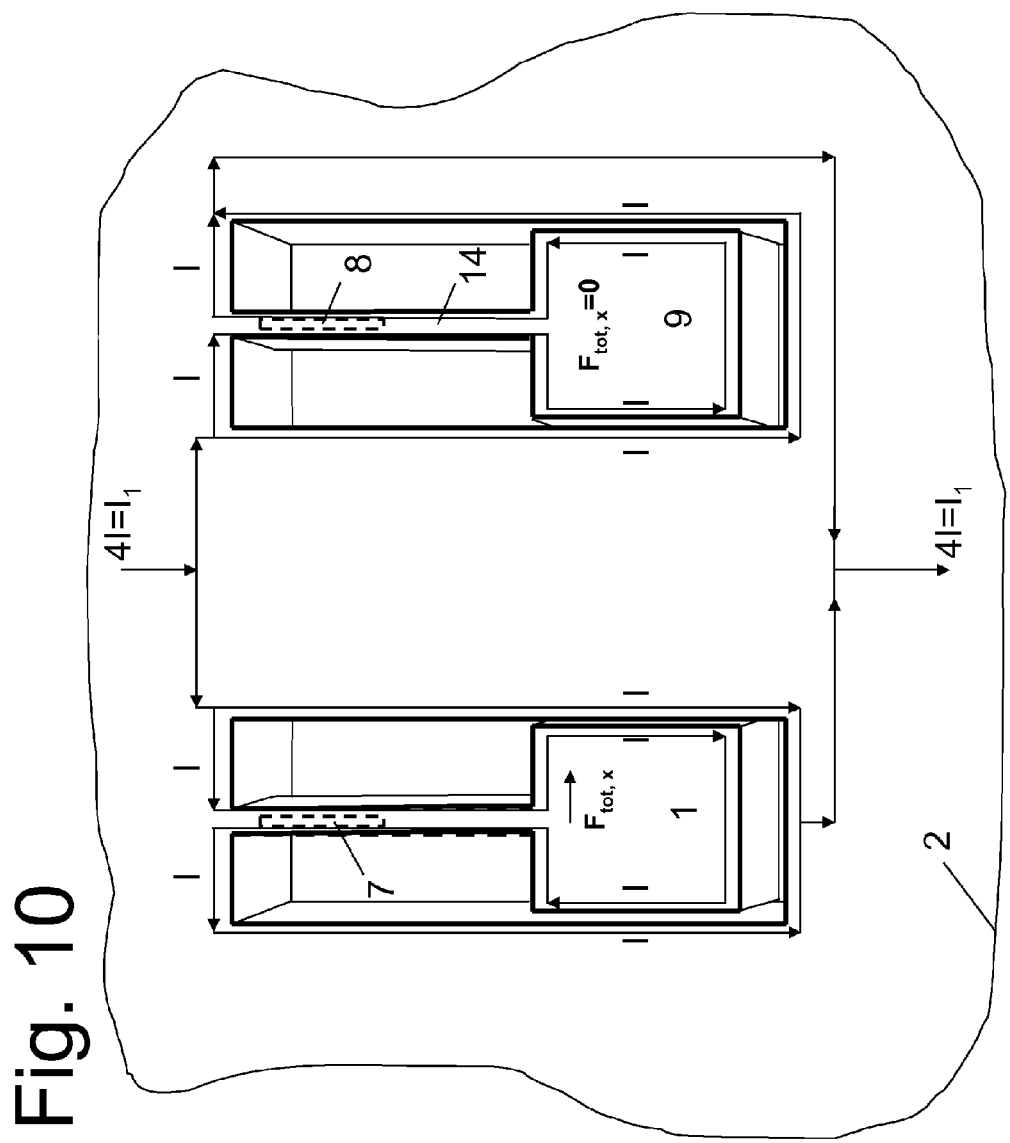
FIG. 10 shows an alternative current flow arrangement in the sensor of FIG. 9.

This provides a way of compensating any simultaneous movement in both sensors 90, 92 of mechanical origin, such as vibrations or accelerations. The piezoresistors 7 and 8 will detect the same deflection of the bodies 1 and 9, as they are on the same substrate 2 and very closely together. Excluding the currents through the piezoresistors 7 and 8, the total current needed for the double sensor to operate is $I_1 = 4I = 2I_0$ as shown in FIG. 10. The force (and consequently, the displacement) of the left-hand sensor for detecting a current $I_1$ is a quarter of that of the embodiment of FIG. 8, as $I_0 = I_1/2$:

$$F_{tot,x} = 10^{-7} I_1^2 \cdot (L/4d)/(1-(\delta/d)^2) \qquad (13)$$

Figure 11:
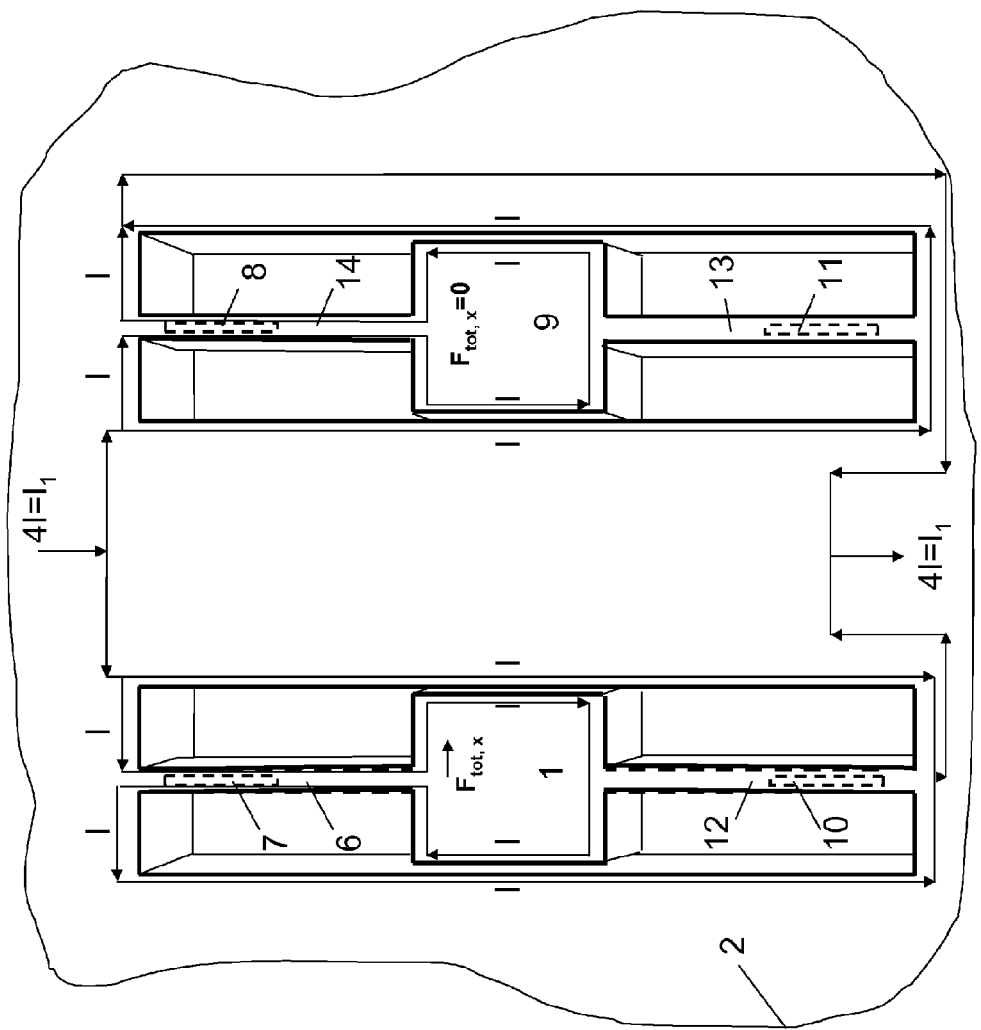
FIG. 11 shows a third example of sensor of the invention including a calibration unit.

FIG. 11 shows an arrangement in which the body 1 is connected through two beams, 6 and 12. This provides more stability and reliability, at the expense of a lower sensitivity for bending. This also allows the use of at least two piezoresistors, 7 and 10 (at least one per beam).

FIG. 11 also shown a vibration compensation structure of the same design, having body 9 suspended by a first beam 14 having a first piezoresistor 8 and a second beam 13 having a second piezoresistor 11.

The output voltage $V_{out}$ of the four-resistor sensor can be determined from:

$$V_{out} \propto (\Delta R_7 + \Delta R_{10})_I + (\Delta R_7 + \Delta R_{10})_{vib} - (\Delta R_8 + \Delta R_{11})_I - (\Delta R_8 + \Delta R_{11})_{vib} \qquad (14)$$

For common-mode vibrations, the contribution to the output voltage will be zero, as $(\Delta R_7 + \Delta R_{10})_{vib} = (\Delta R_8 + \Delta R_{11})_{vib}$. The output related to the current I to be measured is:

$$V_{out} \propto (\Delta R_7 + \Delta R_{10})_I \qquad (15)$$

because $(\Delta R_8 + \Delta R_{11})_I = 0$ for all values of current I.

Figure 12:
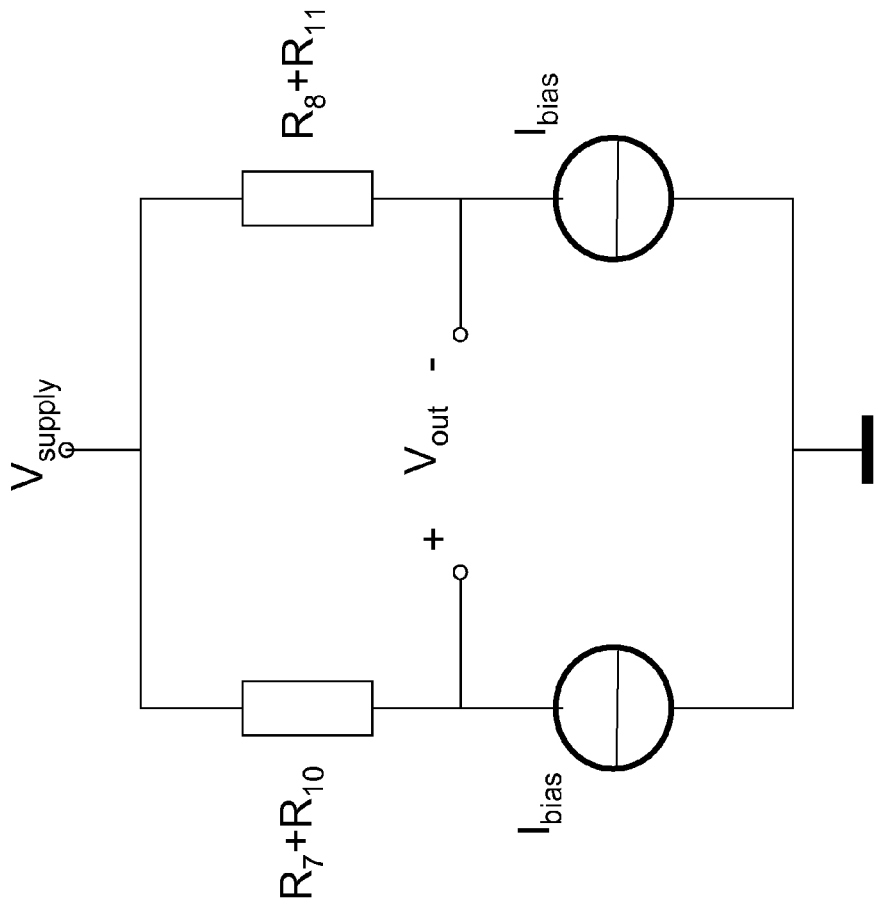
FIG. 12 shows an example of sensing circuitry.

FIG. 12 shows, as an example, one possible circuit to measure the output of this four-resistor sensor. The two piezoresistors of each sensor form a series pair. A bias current is driven though the each piezoresistor pair. The difference in voltage drop across the two pairs is detected by a comparator (not shown). When $R_7$, $R_8$, $R_{10}$, and $R_{11}$ are equal in the absence of current I (no strain) $V_{out}$ will be zero. Similarly, in the absence of vibration or acceleration, $V_{out}$ will be zero.

When there is vibration, the change to $R_7 + R_{10}$ is the same as the change to $R_8 + R_{11}$, so that the output does not change. The only change in output thus results from beam bending only in the main sensor, and which therefore derives from the current detection.

The invention is of particular benefit for the measurement of currents flowing in a conductor on an integrated circuit. The invention enables supply line currents to be measured without a series resistance or other passive element in the line. The invention uses a body that moves under the influence of the mutually attracting or repelling force between two conductors in proximity. The movement of the body may be detected by the variation of strain in a bar connected to that body, for example by piezoresistive measurement as described above. However the movement may be detected by other means such as the changing distance of the body to its frame (by capacitive measurement).

It will be understood that the current to be sensed is the total current into the input conductor. However, this is split into portions in different ways in different embodiments, so that different fractions of this current flow in the adjacent conductors of different embodiments. However, in all cases, the current to be sensed can be determined by simple calculations. The claims should be understood accordingly.

Various modifications will be apparent to those skilled in the art.

The invention claimed is:

1. A current sensor, comprising:
   an input conductor that is configured to be supplied with a current to be sensed;
   an output conductor from which the current to be sensed is output;
   a first path between the input conductor and the output conductor, wherein the first path is provided on a first movable element and a first fixed element, and defines:
      a first path portion on the first fixed element and a second path portion on one side of the first movable element, wherein the first path portion and the second path portion have current flows in an identical direction, and
      a third path portion on the first fixed element and a fourth path portion on an opposite side of the first movable element, wherein the third path portion and the fourth path portion have current flows in opposite directions; and
   a first detecting arrangement configured to detect side to side movement of the first movable element.

2. The sensor as claimed in claim 1, wherein the first path comprises a closed path, having a first tap into the input conductor and a second tap out of the output conductor.

3. The sensor as claimed in claim 2, wherein the first movable element comprises:
   a beam arrangement; and
   a head, with the first path extending around the beam arrangement and the head, and the second path portion and the fourth path portion are at opposite sides of the head.

4. The sensor as claimed in claim 1, wherein the first movable element comprises:
   a beam arrangement; and
   a head, with the first path extending around the beam arrangement and the head, and the second path portion and the fourth path portion are at opposite sides of the head.

5. The sensor as claimed in claim 4, wherein the first movable element is sandwiched between the first path portion and the third path portion.

6. The sensor as claimed in claim 5, wherein the first detecting arrangement is mounted on the beam arrangement.

7. The sensor as claimed in claim 4, wherein the first detecting arrangement is mounted on the beam arrangement.

8. The sensor as claimed in claim 7, wherein the first detecting arrangement comprises:
   at least one piezoresistive element.

9. The sensor as claimed in claim 1, wherein the beam arrangement comprises:
   a single beam.

10. The sensor as claimed in claim 4, wherein the beam arrangement comprises:
    two beams on opposite sides of the head.

11. The sensor of claim 4, wherein the head is configured to translate rather than rotate.

12. The sensor as claimed in claim 1, further comprising:
    a calibration part configured to detect movement of the sensor which is independent of the current being sensed.

13. The sensor as claimed in claim 12, wherein the calibration part comprises:
    a second path provided on a second movable element and a second fixed element, and the second path defines:
       a fifth path portion on the second fixed element and a sixth path portion on one side of the second movable element,
       a seventh path portion on the second fixed element and an eighth path portion on an opposite side of the second movable element, wherein the second path is arranged such that current flow around the path does not induce movement of the beam; and
    a second detecting arrangement configured to detect movement of the second movable element.

14. The sensor as claimed in claim 1, wherein the first movable element and the first fixed element comprise part of a MEMS structure.

15. The sensor as claimed in claim 1, wherein the first path comprises a closed path, with a tap into the first path made by the input conductor and a tap out of the first path made by the output conductor.

16. The sensor as claimed in claim 1, further comprising:
    a calibration part configured to detect movement of the sensor which is independent of the current being sensed.

17. The sensor as claimed in claim 1, wherein the first movable element and the first fixed element comprise part of a MEMS structure.

18. A current sensing method, comprising:
    providing a current to be sensed;
    using the current to be sensed to provide current to a first path on a movable element and a fixed element, wherein the first path defines:
       a first path portion on the fixed element and a second path portion on one side of the movable element, wherein the first path portion and the second path portion have current flows in an identical direction, and
       a third path portion on the fixed element and a fourth path portion on an opposite side of the movable element, wherein the third path portion and the fourth path portion have current flows in opposite directions;
    outputting the current to be sensed; and
    detecting side to side movement of the movable element to enable the current to be sensed to be determined.

* * * * *